(12) United States Patent
Ruan et al.

(10) Patent No.: US 12,181,533 B2
(45) Date of Patent: Dec. 31, 2024

(54) METHOD AND DEVICE FOR DETERMINING AVAILABLE CAPACITY OF BATTERY, MANAGEMENT SYSTEM, AND STORAGE MEDIUM

(71) Applicant: Contemporary Amperex Technology (HONG KONG) LIMITED, Hong Kong (CN)

(72) Inventors: Jian Ruan, Ningde (CN); Mingshu Du, Ningde (CN); Shenzhi Tang, Ningde (CN); Shichao Li, Ningde (CN); Yanhua Lu, Ningde (CN); Wei Zhang, Ningde (CN)

(73) Assignee: Contemporary Amperex Technology (Hong Kong) Limited, Hong Kong (CN)

( * ) Notice: Subject to any disclaimer, the term of this patent is extended or adjusted under 35 U.S.C. 154(b) by 0 days.

(21) Appl. No.: 18/170,412

(22) Filed: Feb. 16, 2023

(65) Prior Publication Data

US 2023/0204674 A1    Jun. 29, 2023

Related U.S. Application Data

(63) Continuation of application No. 16/857,135, filed on Apr. 23, 2020, now Pat. No. 11,609,276.

(30) Foreign Application Priority Data

Apr. 25, 2019  (CN) .......................... 201910338512.1

(51) Int. Cl.
*G01R 31/36*    (2020.01)
*G01R 31/387*   (2019.01)
(Continued)

(52) U.S. Cl.
CPC ....... *G01R 31/387* (2019.01); *G01R 31/3648* (2013.01); *H01M 10/425* (2013.01);
(Continued)

(58) Field of Classification Search
CPC . G01R 31/387; G01R 31/3648; H02J 7/0048; H01M 10/425; H01M 2010/4278; H01M 10/48
(Continued)

(56) References Cited

U.S. PATENT DOCUMENTS 6,577,104 B2    6/2003  Sakakibara
9,244,132 B2    1/2016  Bond et al.
(Continued)

FOREIGN PATENT DOCUMENTS

JP    2008039526 A    2/2008
JP    2018007410 A    1/2018

OTHER PUBLICATIONS

Notice of Reasons for Refusal issued in JP Application No. 2020-573144, mailed Mar. 1, 2024, 5 pages.

*Primary Examiner* — Alexander Satanovsky
*Assistant Examiner* — Trung Q Nguyen
(74) *Attorney, Agent, or Firm* — STERNE, KESSLER, GOLDSTEIN & FOX P.L.L.C.

(57) ABSTRACT

A method and device for determining an available capacity of a battery, a battery management system, and a storage medium, relating to the field of battery technologies. The method includes: obtaining the at least one DOD interval corresponding to the SOC interval of the operation of the battery, and the number of cycles and the cycle temperature corresponding to the at least one DOD interval; obtaining a recoverable amount of capacity fade of the battery according
(Continued)

to the at least one DOD interval, the number of cycles and the cycle temperature, and determining an actual available capacity of the battery.

5 Claims, 7 Drawing Sheets

(51) Int. Cl.
*H01M 10/42* (2006.01)
*H01M 10/48* (2006.01)
*H02J 7/00* (2006.01)

(52) U.S. Cl.
CPC ........... *H01M 10/48* (2013.01); *H02J 7/0048* (2020.01); *H01M 2010/4278* (2013.01)

(58) Field of Classification Search
USPC ............. 324/415, 437, 425–435, 76.11, 126, 324/756.05, 538, 200, 207.13, 500–530
See application file for complete search history.

(56) References Cited

U.S. PATENT DOCUMENTS

| | | | |
|---|---|---|---|
| 9,678,165 | B2 | 6/2017 | Joe et al. |
| 11,609,276 | B2* | 3/2023 | Ruan .................... H01M 10/425 |
| 2008/0150489 | A1* | 6/2008 | Shun-Hsing .......... H01M 10/44 |
| | | | 320/136 |
| 2010/0121587 | A1 | 5/2010 | Vian et al. |
| 2010/0324846 | A1 | 12/2010 | Marsh et al. |
| 2012/0049802 | A1* | 3/2012 | Barsukov ............. G01R 31/367 |
| | | | 320/136 |
| 2016/0218397 | A1 | 7/2016 | Sasaki et al. |
| 2017/0356962 | A1 | 12/2017 | Takahashi et al. |
| 2018/0095141 | A1* | 4/2018 | Wild .................. G01C 21/3407 |
| 2020/0175212 | A1 | 6/2020 | Zhang et al. |
| 2020/0326379 | A1* | 10/2020 | Yao ...................... G01R 31/392 |
| 2022/0209547 | A1* | 6/2022 | Peng ..................... H02J 7/0016 |
| 2023/0070151 | A1* | 3/2023 | Zhang ..................... H02J 3/381 |

* cited by examiner

METHOD AND DEVICE FOR DETERMINING AVAILABLE CAPACITY OF BATTERY, MANAGEMENT SYSTEM, AND STORAGE MEDIUM

CROSS-REFERENCE TO RELATED APPLICATION

This application is a continuation of U.S. application. Ser. No. 16/857,135, filed Apr. 23, 2020, which claims priority to Chinese Patent Application No. 201910338512.1, filed Apr. 25, 2019. Each of these applications is hereby incorporated by reference in its entirety.

TECHNICAL FIELD

The present disclosure relates to the field of battery technologies, and in particular, to a method and device for determining an available capacity of a battery, a battery management system, and a storage medium.

BACKGROUND

The capacity of a battery refers to the amount of power stored in the battery, and accurate estimation of the available capacity of the battery is of great importance to the estimation of residual capacity and residual energy, etc., and is also an important parameter for reflecting an aging state of the battery cell Currently, the method of estimating the available capacity of the battery generally comprises: an offline capacity test to obtain a real capacity, wherein the available capacity of the battery is updated according to a calibrated aging curve, or is online updated according to an open-circuit voltage and an SOC-OCV (open-circuit voltage) curve. However, some batteries suffer from two types of capacity fade: unrecoverable capacity fade and recoverable capacity fade (like a memory effect). At present, the method of estimating the available capacity of the battery cell can only calculate a sum of the two types of capacity fade, and cannot accurately obtain the available capacity of the battery.

SUMMARY

In view of the above, a technical problem to be solved by the present disclosure is to provide a method and device for determining an available capacity of a battery, a battery management system, and a storage medium.

According to an aspect of the present disclosure, there is provided a method for determining an available capacity of a battery, comprising: obtaining an SOC interval corresponding to an operation of the battery, and determining at least one DOD interval corresponding to the SOC interval; obtaining a number of cycles and a cycle temperature corresponding to the at least one DOD interval; obtaining a recoverable amount of capacity fade of the battery according to the at least one DOD interval, the number of cycles and the cycle temperature; and determining an actual available capacity of the battery based on the recoverable amount of capacity fade.

Alternatively, determining at least one DOD interval corresponding to the SOC interval of the operation of the battery comprises: acquiring setting information for setting the at least one DOD interval in an SOC usage interval corresponding to the battery; and determining the at least one DOD interval corresponding to the SOC interval based on the setting information.

Alternatively, obtaining a recoverable amount of capacity fade of the battery according to the at least one DOD interval, the number of cycles, and the cycle temperature comprises: pre-establishing correspondence information between the recoverable amount of capacity fade, the at least one DOD interval, the number of cycles and the cycle temperature; and obtaining the recoverable amount of capacity fade corresponding to the at least one DOD interval, the number of cycles and the cycle temperature based on the correspondence information.

Alternatively, the method further comprises: determining the SOC interval based on a first SOC of the battery before the battery is charged and a second SOC of the battery after the battery is charged; obtaining at least one DOD interval corresponding to the SOC interval, and obtaining the number of cycles and the cycle temperature corresponding to each DOD interval; obtaining an interval recoverable amount of capacity fade corresponding to each DOD interval based on the correspondence information and according to the at least one DOD interval, the number of cycles and the cycle temperature; obtaining a first single recoverable amount of capacity fade of the battery in the current operation based on at least one of the interval recoverable amount of capacity fade; and obtaining the recoverable amount of capacity fade of the battery under the current operating condition according to the first single recoverable amount of capacity fade.

Alternatively, obtaining the recoverable amount of capacity fade of the battery under the current operating condition according to the first single recoverable amount of capacity fade comprises: obtaining one or more second single recoverable amount of capacity fade corresponding to one or more previous operations of the battery; and processing the one or more second single recoverable amount of capacity fade and the first single recoverable amount of capacity fade according to a preset first calculation rule, to obtain the recoverable amount of capacity fade of the battery under the current operating condition.

Alternatively, the method further comprises: obtaining a second single recoverable amount of capacity fade corresponding to a last operation of the battery; obtaining two weight values corresponding to the second single recoverable amount of capacity fade and the first single recoverable amount of capacity fade, and performing a weighted calculation on the second single recoverable amount of capacity fade and the first single recoverable amount of capacity fade based on the two weight values to obtain the recoverable amount of capacity fade of the battery under the current operating condition.

Alternatively, the method further comprises: obtaining a plurality of SOC intervals corresponding to multiple cycles of the battery; obtaining a plurality of DOD intervals corresponding to the plurality of SOC intervals, and obtaining the number of cycles and the cycle temperature corresponding to each DOD interval; obtaining a plurality of interval recoverable amounts of capacity fade corresponding to the plurality of DOD intervals based on the correspondence information and according to the DOD intervals, the number of cycles and the cycle temperature; and obtaining the recoverable amount of capacity fade of the battery under the current operating condition according to the plurality of interval recoverable amounts of capacity fade.

Alternatively, obtaining the recoverable amount of capacity fade of the battery under the current operating condition according to the plurality of interval recoverable amounts of capacity fade comprises: obtaining an interval recoverable amount of capacity fade corresponding to each SOC interval from the plurality of interval recoverable amounts of capacity fade; obtaining an accumulated recoverable amount of capacity fade corresponding to each SOC interval based on the interval recoverable amount of capacity fade corresponding to each SOC interval; and processing a plurality of accumulated recoverable amounts of capacity fade corresponding to the plurality of SOC intervals according to a preset second calculation rule, to obtain the recoverable amount of capacity fade of the battery under the current operating condition.

Alternatively, processing a plurality of accumulated recoverable amounts of capacity fade corresponding to the plurality of SOC intervals according to a preset second calculation rule, to obtain the recoverable amount of capacity fade of the battery under the current operating condition, comprises: obtaining a plurality of weight values corresponding to the plurality of accumulated recoverable amounts of capacity fade, and performing weighted calculation on the plurality of accumulated recoverable amounts of capacity fade based on the plurality of weight values, to obtain the recoverable amount of capacity fade of the battery under the current operating condition.

Alternatively, determining an actual available capacity of the battery based on the recoverable amount of capacity fade comprises: obtaining a first available capacity of the battery based on battery operation data; calculating the actual available capacity of the battery based on the first available capacity and the recoverable amount of capacity fade, and obtaining a state of health of the battery based on the actual available capacity.

Alternatively, under the condition that the recoverable amount of capacity fade is greater than or equal to a preset threshold, it is determined that the recoverable amount of capacity fade of the battery needs to be eliminated and an operation is made accordingly.

Alternatively, the method further comprises: determining a number of times of charging and discharging, and performing a full charge and full discharge cycle operation on the battery according to the number of times of charging and discharging, to eliminate the recoverable amount of capacity fade of the battery.

According to another aspect of the present disclosure, there is provided a device for determining an available capacity of a battery, comprising: an information obtaining module, for obtaining an SOC interval corresponding to an operation of the battery, determining at least one DOD interval corresponding to the SOC interval; and obtaining a number of cycles and a cycle temperature corresponding to the at least one DOD interval; a recoverable capacity obtaining module, for obtaining a recoverable amount of capacity fade of the battery according to the at least one DOD interval, the number of cycles and the cycle temperature; an available capacity correcting module, for determining an actual available capacity of the battery based on the recoverable amount of capacity fade; and a recoverable capacity processing module, for determining that the recoverable amount of capacity fade of the battery needs to be eliminated and an operation is made accordingly under the condition that the recoverable amount of capacity fade is greater than or equal to a preset threshold.

According to a still another aspect of the present disclosure, there is provided a battery management system comprising: the device for determining an available capacity of a battery as described above.

According to a further aspect of the present disclosure, there is provided a computer readable storage medium having stored thereon computer instructions, which, when executed by a processor, perform the method as described above.

The method and device for determining an available capacity of a battery, the battery management system and the storage medium according to the present disclosure obtain at least one DOD interval corresponding to an SOC interval of an operation of the battery, and a number of cycles and a cycle temperature corresponding to the at least one DOD interval; obtain a recoverable amount of capacity fade of the battery according to the at least one DOD interval, the number of cycles and the cycle temperature; and determine an actual available capacity of the battery. With respect to the battery with the recoverable amount of attenuation capacity, the accuracy of estimating the actual available capacity and the SOH is improved, and the real aging state of the battery can be accurately estimated, which can improve reliability of the battery and prolong the service life of the battery.

BRIEF DESCRIPTION OF THE DRAWINGS

In order to more clearly illustrate the embodiments of the present disclosure or the technical solutions in the prior art, the drawings required for describing the embodiments or the prior art will be briefly discussed below, and it is obvious that the drawings in the following description are merely some embodiments of the present disclosure, and that other drawings can be obtained by those skilled in the art without paying out any creative efforts.

DETAILED DESCRIPTION

The present disclosure will be described more comprehensively below with reference to the accompanying drawings, in which exemplary embodiments of the present disclosure are shown. The technical solutions in the embodiments of the present disclosure will be clearly and completely described below with reference to the drawings in the embodiments of the present disclosure, and it is apparent that the described embodiments are merely some embodiments of the present disclosure, but not all embodiments. All other embodiments, which can be derived by a person of ordinary skill in the art based on the embodiments in the present disclosure without creative efforts, are within the scope of protection of the present disclosure. Aspects of the technical solutions of the present disclosure are described below in conjunction with various figures and embodiments.

The terms "first", "second", and the like, hereinafter, are used for descriptive distinction only, but do not have other special meanings.

Figure 1:
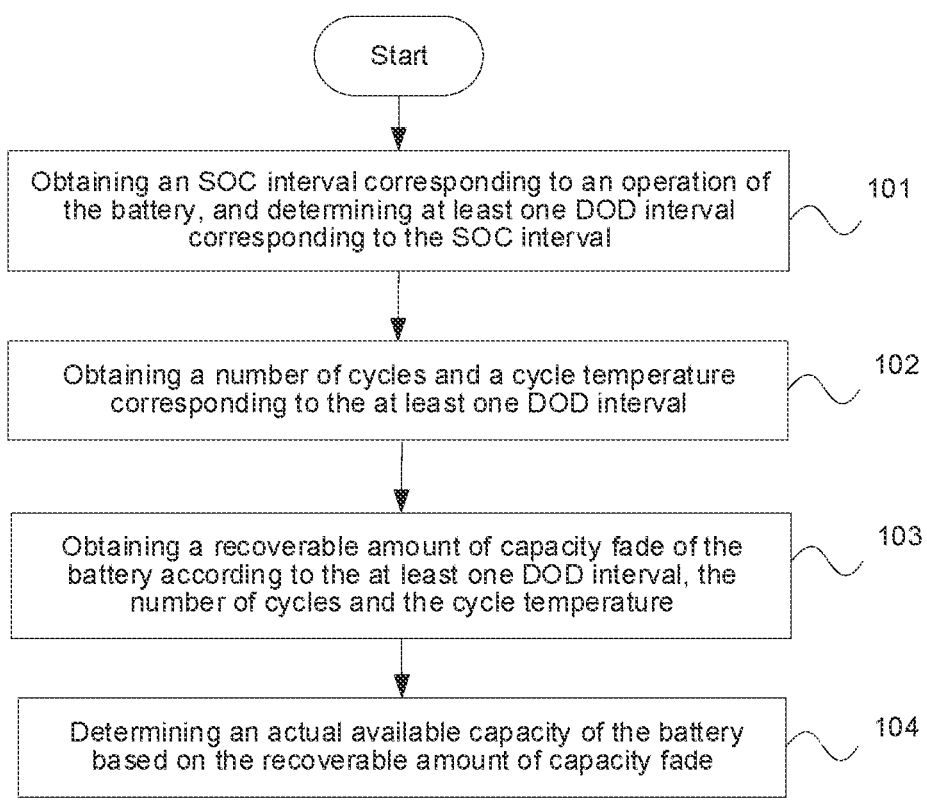
FIG. 1 is a schematic flow chart of one embodiment of a method for determining an available capacity of a battery according to the present disclosure.

FIG. 1 is a schematic flow chart of one embodiment of a method for determining an available capacity of a battery according to the present disclosure, which as shown in FIG. 1, comprises a step 101, of obtaining an SOC (State of Charge) interval corresponding to an operation of the battery, and determining at least one DOD interval corresponding to the SOC interval.

The battery may be a single battery cell, a battery pack, a battery module, etc. having a recoverable fade capacity, for example, the battery may be a lithium battery, a lithium battery pack, etc. The operation of the battery refers to the charging/discharging cycle operation of battery, and the DOD (depth of discharge) interval refers to an SOC operation interval set in an SOC usage interval corresponding to the battery. When the battery is charged or discharged, the SOC operation interval corresponding to the charging or discharging of the battery may be determined, and the at least one DOD interval corresponding to the SOC interval may be determined.

For example, the SOC usage interval corresponding to the battery is 0 to 100%, and five DOD intervals are set in the SOC usage interval, where the five DOD intervals are 0 to 20%, 20 to 40%, 40 to 60%, 60 to 80%, and 80 to 100%, respectively. If the battery is discharged once, the SOC interval corresponding to the discharging of the battery at this time is 80-20%, then the SOC interval of 80-20% corresponds to three DOD intervals, namely 20-40% DOD interval, 40-60% DOD interval and 60-80% DOD interval.

The method further comprises a step 102, of obtaining a number of cycles and a cycle temperature corresponding to the at least one DOD interval.

The number of cycles is a number of cycle operations of the battery in the at least one DOD interval. For example, the number of cycles corresponding to the at least one DOD interval of 20 to 40% is a number of cycles of charging and discharging of the battery in the at least one DOD interval of 20 to 40%. The cycle temperature is a battery temperature at which the battery operate in the at least one DOD interval. For example, the cycle temperature corresponding to the at least one DOD interval of 20 to 40% is the temperature of the battery in the at least one DOD interval of 20 to 40% in this operation.

The method further comprises a step 103, of obtaining a recoverable amount of capacity fade of the battery according to the at least one DOD interval, the number of cycles and the cycle temperature.

There may be various ways to obtain the recoverable amount of capacity fade of the battery according to the at least one DOD interval, the number of cycles, and the cycle temperature. For example, the magnitude of the recoverable amount of capacity fade can be obtained through experiments, a correspondence between the magnitude of the recoverable amount of capacity fade and the at least one DOD interval, the number of cycles, and the cycle temperature is established, and the recoverable amount of capacity fade can be obtained based on the correspondence.

The method further comprises a step 104, of determining an actual available capacity of the battery based on the recoverable amount of capacity fade.

The battery may have unrecoverable capacity fade and recoverable capacity fade in the charging and discharging process, wherein the unrecoverable capacity fade is an unavailable capacity caused by the aging of the battery cell of the battery, and the recoverable capacity fade is a capacity which can be released again by the battery cell of the battery after a certain regulation in the cycling operation thereof, and this capacity cannot reflect the aging state of the battery cell. Due to the recoverable capacity fade, the real aging condition of the current battery cell will be possibly overestimated, and therefore, the actual available capacity of the battery needs to be corrected by using the recoverable amount of capacity fade, and the actual available capacity of the battery is the real available capacity of the battery.

In one embodiment, there may be a number of ways to obtain the at least one DOD interval corresponding to the SOC interval of the operation of the battery. For example, setting information for setting the at least one DOD interval in the SOC usage interval corresponding to the battery is acquired, and the at least one DOD interval corresponding to the SOC interval is determined based on the setting information.

For example, the setting information for setting the at least one DOD interval in the SOC usage interval corresponding to the battery is information on five DOD intervals, which are 0 to 20%, 20 to 40%, 40 to 60%, 60 to 80%, and 80 to 100%, respectively. Based on the setting information, the at least one DOD interval corresponding to the SOC interval of 20 to 60% is determined to be the at least one DOD interval of 20 to 40% and the at least one DOD interval of 40 to 60%.

Figure 2:
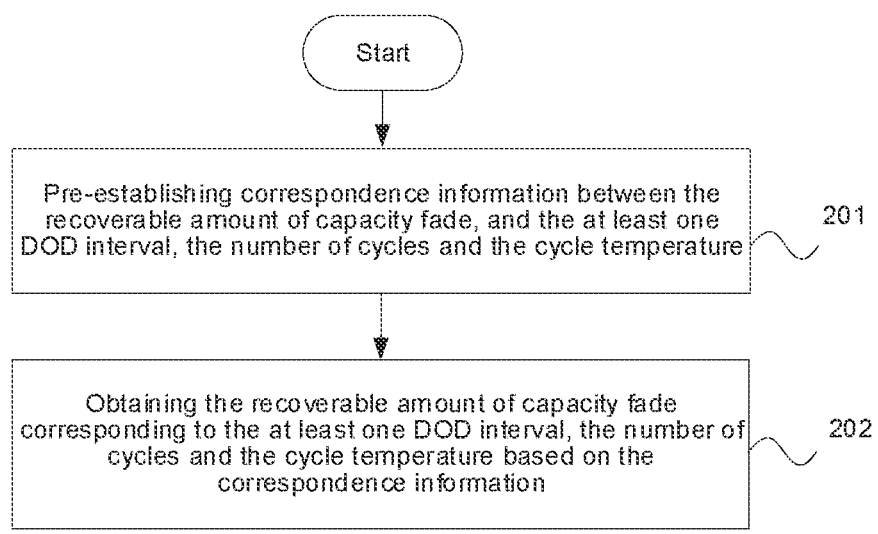
FIG. 2 is a schematic flow chart illustrating obtaining a recoverable amount of capacity fade in one embodiment of a method for determining an available capacity of a battery according to the present disclosure.

FIG. 2 is a schematic flow chart illustrating obtaining a recoverable amount of capacity fade in one embodiment of a method for determining an available capacity of a battery according to the present disclosure, which as shown in FIG. 2, comprises:

a step 201, of pre-establishing correspondence information between the recoverable amount of capacity fade and the at least one DOD interval, the number of cycles, and the cycle temperature.

The correspondence information between the recoverable amount of capacity fade and the at least one DOD interval, the number of cycles, and the cycle temperature can be established through experimental data, and the correspondence information comprises a functional relation, a table, a model and the like.

The method further comprises a step 202, of obtaining the recoverable amount of capacity fade corresponding to the at least one DOD interval, the number of cycles, and the cycle temperature based on the correspondence information.

The recoverable amount of capacity fade corresponding to different DOD intervals, different numbers of cycles and different cycle temperatures is calibrated through offline experiments. A operating condition cycle test is performed offline on the battery with a recoverable capacity fade characteristic, to test the recoverable amount of capacity fade corresponding to different DOD intervals, different numbers of cycles and different cycle temperatures. The recoverable amount of capacity fade of the battery cell of the battery can be obtained through various capacity test flows.

For example, the capacity of the battery cell is tested during the capacity test of the battery cell, and the available capacity of the battery cell without the recoverable amount of capacity fade under several full charge and full discharge cycles is counted; the battery cells and the battery cell parallel samples are circularly used in different DOD intervals and under different cycle temperature conditions, and charge and discharge capacities of part of the battery cells are detected after several cycles; the other battery cells continue to circulate, and the charge and discharge capacities of the battery cells after N cycles are measured; and finally, the available capacity of the battery cell without the recoverable amount of capacity fade under the current condition is counted through the capacity test of the battery cell and the full charge and full discharge cycles.

The correspondence functional relation or table correspondence etc. between the recoverable amount of capacity fade and the at least one DOD interval, the number of cycles and the cycle temperature is statistically analyzed. For example, a correspondence table between the recoverable amount of capacity fade and the at least one DOD interval, the number of cycles, and the cycle temperature is established as shown in Table 1 below:

TABLE 1 correspondence table between the recoverable amount of capacity fade and the at least one DOD interval and the number of cycles at T1

| | Recoverable amount of capacity fade | | | |
|---|---|---|---|---|
| | N1 | N2 | ... | NX |
| [S1, S2] | D1 | D2 | ... | DX |
| ... | ... | ... | ... | ... |
| [SA, SB] | D1A | D1B | ... | D1X |

In the Table 1, T1 is the cycle temperature, N1, N2, ... , NX represent different numbers of cycles, [S1, S2], ... , [SA, SB] represent different DOD intervals, D1, ... , D1X in the Table 1 represent the interval recoverable amount of capacity fade of the battery under different operating conditions, D1, ... , D1X can be positive or negative, and D1, ... , D1X can be obtained through relevant tests, experiments and the like.

The correspondence between the recoverable amount of capacity fade and the at least one DOD interval, the number of cycles, and the cycle temperature may also include tables under a plurality of different temperature dimensions. For example, a plurality of cycle temperatures such as T2, T3, T4 are set for a certain battery, and related tests and experiments are made, to obtain a plurality of tables for correspondence between the recoverable amount of capacity fade and the at least one DOD interval, the number of cycles at a plurality of cycle temperatures such as T2, T3, T4, and the content of each table is shown in Table 1.

In one embodiment, if the SOC interval cannot correspond to a plurality of complete DOD intervals, for example, a 30-40% interval in the SOC interval of 30-60% corresponds to the at least one DOD interval of 20-40%, the number of cycles and the cycle temperature corresponding to the at least one DOD interval of 20-40% in the operation of the battery at this time are determined, a corresponding coefficient is set, and when the recoverable amount of capacity fade is calculated, the coefficient is multiplied by the interval recoverable amount of capacity fade corresponding to the at least one DOD interval of 20-40%, the number of cycles, and the cycle temperature. Similarly, if the cycle temperature is located between TI and T2, the cycle temperature may be determined as T1 and a corresponding coefficient may be set, and the interval recoverable amount of capacity fade at T1 may be multiplied by this coefficient when the recoverable energy information is obtained.

Besides the way of table, the correspondence between the recoverable amount of capacity fade and the at least one DOD interval, the number of cycles and the cycle temperature can also be obtained through function fitting to obtain a functional relation, and a regression equation or a neural network method and the like can be adopted.

Figure 3:
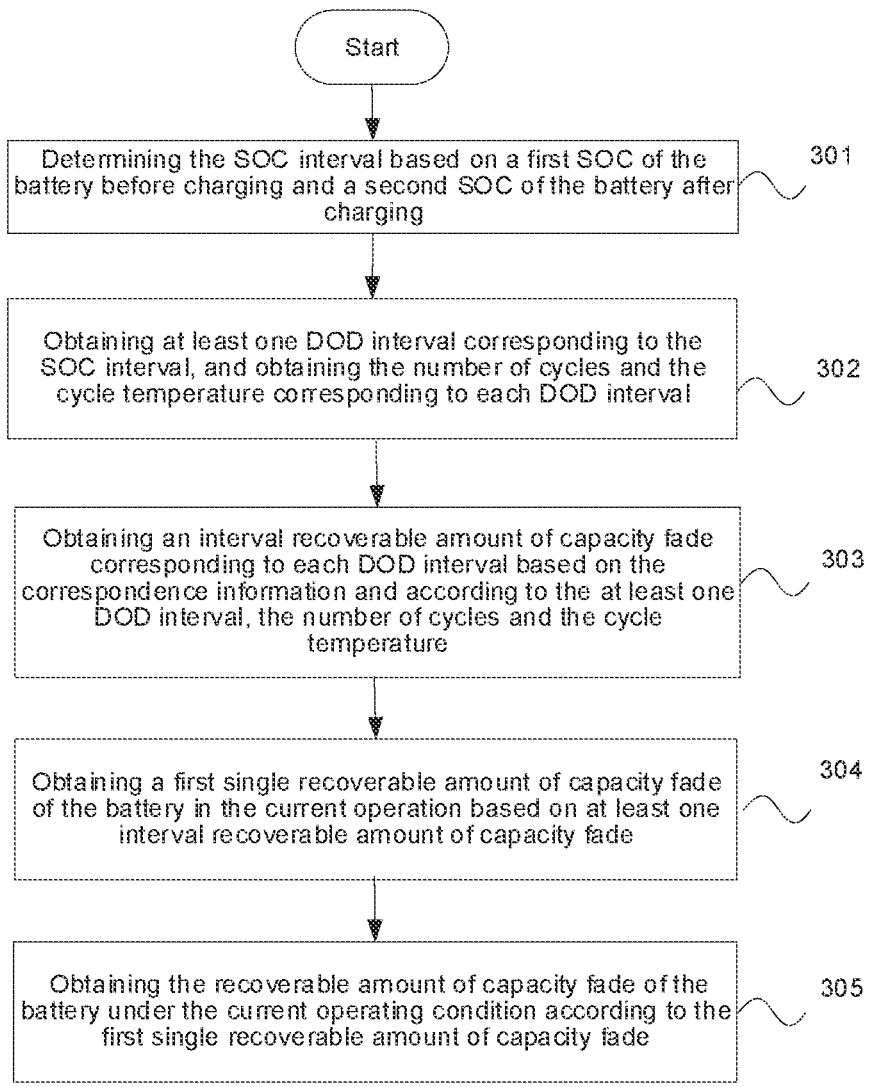
FIG. 3 is a schematic flow chart illustrating obtaining a recoverable amount of capacity fade in another embodiment of a method for determining an available capacity of a battery according to the present disclosure.

FIG. 3 is a schematic diagram illustrating obtaining a recoverable amount of capacity fade in another embodiment of a method for determining an available capacity of a battery according to the present disclosure, which as shown in FIG. 3, comprises:

a step 301, of determining the SOC interval based on a first SOC of the battery before the battery is charged and a second SOC of the battery after the battery is charged;

a step 302, of obtaining at least one DOD interval corresponding to the SOC interval, and obtaining the number of cycles and the cycle temperature corresponding to each DOD interval;

a step 303, of obtaining an interval recoverable amount of capacity fade corresponding to each DOD interval based on the correspondence information and according to the at least one DOD interval, the number of cycles and the cycle temperature;

a step 304, of obtaining a first single recoverable amount of capacity fade of the battery in the current operation based on at least one interval recoverable amount of capacity fade.

For example, it may be obtained that the SOC interval for battery charging is a first SOC to a second SOC, a plurality of DOD intervals corresponding to the SOC interval may be obtained, and the number of cycles and the cycle temperature corresponding to each DOD interval may be obtained. The interval recoverable amount of capacity fade corresponding to each DOD interval can be obtained by table lookup or a functional relation and according to the at least one DOD interval, the number of cycles and the cycle temperature. The obtained plurality of interval recoverable amounts of capacity fade are added to obtain a first single recoverable amount of capacity fade of the battery in the current operation.

The method further comprises a step 305, of obtaining the recoverable amount of capacity fade of the battery under the current operating condition according to the first single recoverable amount of capacity fade.

There may be various ways to obtain the recoverable amount of capacity fade of the battery under the current operating condition according to the first single recoverable amount of capacity fade. For example, one or more second single recoverable amount of capacity fade corresponding to one or more previous operation of the battery is obtained, and the one or more second single recoverable amount of capacity fade and the first single recoverable amount of capacity fade are processed according to a preset first calculation rule, to obtain the recoverable amount of capacity fade of the battery under the current operating condition.

There may be various first calculation rules, comprising a weighted calculation rule or the like. For example, a second single recoverable amount of capacity fade corresponding to the last operation of the battery is obtained, two weight values corresponding to the second single recoverable amount of capacity fade and the first single recoverable amount of capacity fade are obtained, and a weighted calculation is performed on the second single recoverable amount of capacity fade and the first single recoverable amount of capacity fade based on the two weight values, so as to obtain the recoverable amount of capacity fade of the battery under the current operating condition.

In one embodiment, the SOC value of the battery before each charging and the SOC value after the charging are recorded, an SOC interval is obtained, at least one DOD interval corresponding to the SOC interval is obtained, and the number of cycles and the cycle temperature corresponding to the at least one DOD interval are obtained. The first single recoverable amount of capacity fade in the current operation of the battery is calculated through table lookup or a functional relation, and a plurality of second single recoverable amounts of capacity fade corresponding to a plurality of previous operations of the battery are calculated based on a first calculation rule to obtain the recoverable amount of capacity fade of the battery under the current operating condition.

For example, a second single recoverable amount D1 of capacity fade corresponding to the last charging of the battery is acquired, and a first single recoverable amount D2 of capacity fade corresponding to the current operation of the battery is obtained, then the recoverable amount of capacity fade of the battery under the current operating condition is Dnew=$\alpha_1 D_1 + \alpha_2 D_2$, where $\alpha_1$ and $\alpha_2$ are weight values (weight coefficients) and a numerical range of $\alpha_1$ and $\alpha_2$ is [−1, 1]. The recoverable amount of capacity fade of the battery can be updated after the battery is charged this time.

Figure 4:
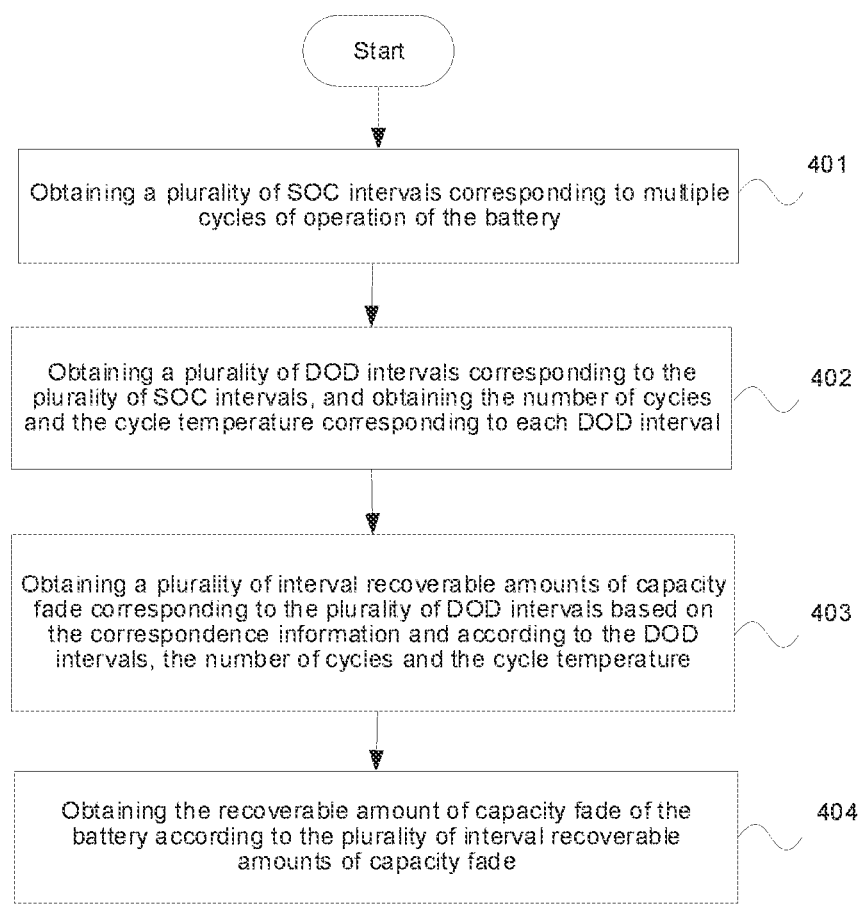
FIG. 4 is a schematic flow chart illustrating obtaining a recoverable amount of capacity fade in yet another embodiment of a method for determining an available capacity of a battery according to the present disclosure.

FIG. 4 is a schematic diagram illustrating obtaining a recoverable amount of capacity fade in yet another embodiment of a method for determining an available capacity of a battery according to the present disclosure, which as shown in FIG. 4, comprises:

a step 401, of obtaining a plurality of SOC intervals corresponding to multiple use cycles of the battery;

a step 402, of obtaining a plurality of DOD intervals corresponding to the plurality of SOC intervals, and obtaining the number of cycles and the cycle temperature corresponding to each DOD interval;

a step 403, of obtaining a plurality of interval recoverable amounts of capacity fade corresponding to the plurality of DOD intervals based on the correspondence information and according to the DOD intervals, the number of cycles and the cycle temperature; and a step 404, of obtaining the recoverable amount of capacity fade of the battery under the current operating condition according to the plurality of interval recoverable amounts of capacity fade.

There are various ways to obtain the recoverable amount of capacity fade of the battery under the current operating condition according to the plurality of interval recoverable amounts of capacity fade. For example, the interval recoverable amount of capacity fade corresponding to each SOC interval is obtained from the plurality of interval recoverable amounts of capacity fade, and an accumulated recoverable amount of capacity fade corresponding to each SOC interval is obtained based on the interval recoverable amount of capacity fade corresponding to each SOC interval. The plurality of accumulated recoverable amounts of capacity fade corresponding to the plurality of SOC intervals are processed according to a preset second calculation rule to obtain the recoverable amount of capacity fade of the battery under the current operating condition.

There may be various second calculation rules, comprising a weighted calculation rule or the like. For example, a plurality of weight values corresponding to the plurality of accumulated recoverable amounts of capacity fade are obtained, and a weighted calculated is performed on the plurality of accumulated recoverable amounts of capacity fade based on the plurality of weight values to obtain the recoverable amount of capacity fade of the battery under the current operating condition.

In one embodiment, a plurality of SOC intervals corresponding to a plurality of charging cycles of the battery are obtained, a plurality of DOD intervals corresponding to the plurality of SOC intervals are obtained, and a number of cycles and cycle temperatures corresponding to each DOD interval are obtained. A plurality of interval recoverable amounts of capacity fade corresponding to the plurality of SOC intervals of the operation of the battery are obtained according to the table lookup or the functional relation and according to the DOD intervals, the number of cycles and the cycle temperature.

An accumulated recoverable amount of capacity fade corresponding to the plurality of SOC intervals of the operation of the battery are obtained based on the interval recoverable amounts of capacity fade corresponding to the plurality of SOC intervals of the operation of the battery, respectively. For example, the interval recoverable amounts of capacity fade corresponding to each SOC interval are added to obtain the accumulated recoverable amount of capacity fade corresponding to each SOC interval. A plurality of accumulated recoverable amounts of capacity fade corresponding to the plurality of SOC intervals are calculated to obtain the recoverable amount of capacity fade of the battery under the current operating condition.

For example, the plurality of accumulated recoverable amounts of capacity fade corresponding to the plurality of SOC intervals are D1, D2, . . . , DN, and the current recoverable amount of capacity fade of the battery is Dnew=$\alpha_1 D_1 + \alpha_2 D_2 + \ldots + \alpha_{n-1} D_{n-1} + \alpha_n D_n$, where $\alpha_1 \sim \alpha_n$ are weight values (weight coefficients) and the numerical range is [−1, 1]. The recoverable amount of capacity fade of the battery is updated after multiple cycles of operation of the battery.

In one embodiment, the currently measured capacity value is recorded when the operating state of the battery reaches a condition for battery capacity estimation or when a battery capacity test is performed at a service station. The condition for the battery capacity estimation may be various conditions, e.g., the number of cycles of operation of the battery reaches a threshold.

There may be various ways to determine the actual available capacity of the battery based on the recoverable amount of capacity fade. For example, a first available capacity of the battery is obtained based on the battery operation data, the actual available capacity of the battery is calculated from the first available capacity and the recoverable amount of capacity fade, and a state of health of the battery is obtained based on the actual available capacity. There may be various ways to obtain the first available capacity of the battery, for example, calculating the first available capacity of the battery by linear interpolation of the accumulated ampere-hour value based on the battery operation data, and the like. The battery may have a recoverable capacity fade part during charging and discharging, and the first available capacity of the battery cannot reflect the aging state of the battery cell, so the recoverable amount of capacity fade may be added to the first available capacity of the battery to obtain the actual available capacity of the battery.

If the recoverable amount of capacity fade is greater than or equal to a preset threshold, it is determined that it is necessary to eliminate the recoverable amount of capacity fade of the battery and an operation is made accordingly. The operation accordingly includes: determining the number of charge and discharge cycles, and performing a full charge and full discharge cycle operation on the battery according to the number of charge and discharge cycles to eliminate the recoverable amount of capacity fade of the battery.

For example, when the recoverable amount of capacity fade or the amount of capacity fade reaches a preset threshold and this may affect the trip of the user, it is needed to prompt the user to maintain the battery or perform N full charge and full discharge cycles to eliminate the recoverable amount of capacity fade, where N is the number of charge and discharge cycles required to eliminate the capacity fade under the current recoverable amount of capacity fade measured by the experiments.

The State Of Health (SOH) is an important parameter reflecting the performance and the service life of the battery, and the SOH is used for estimating a real aging state of the battery cell. The state of health SOH of the battery often refers to a ratio of the capacity of the aged battery to the capacity of a fresh battery cell. The battery is inevitably aged or deteriorated in a long-term use, so that the battery capacity is notably reduced, and if the SOH is not corrected after the battery capacity is attenuated, the calculation error of the State of Charge (SOC) of the battery is possibly increased, and problems such as overcurrent risk and the like exist. There are a variety of ways to obtain the state of health of the battery based on the actual available capacity. For example, SOH of the battery=actual available capacity/ nominal capacity value, wherein the nominal capacity value may be a standard capacity value preset at the time of shipment.

Figure 5:
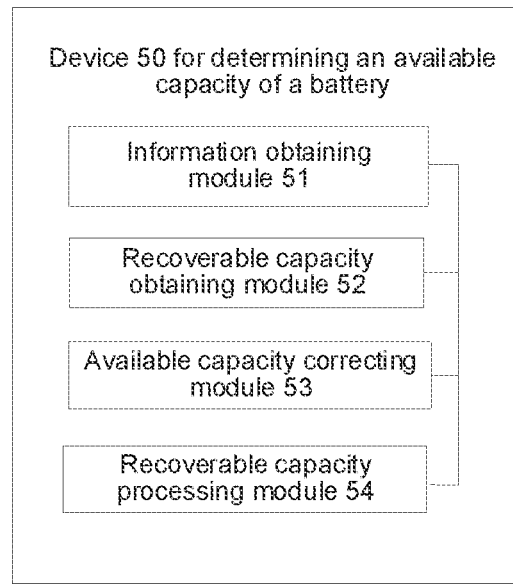
FIG. 5 is a schematic block diagram of one embodiment of a device for determining an available capacity of battery according to the present disclosure.

In one embodiment, as shown in FIG. 5, the present disclosure provides a device 50 for determining an available capacity of a battery, comprising: an information obtaining module 51, a recoverable capacity obtaining module 52, an available capacity correcting module 53, and a recoverable capacity processing module 54. The information obtaining module 51 is for obtaining an SOC interval corresponding to an operation of the battery, determining at least one DOD interval corresponding to the SOC interval, and obtaining a number of cycles and a cycle temperature corresponding to the at least one DOD interval. The information obtaining module 51 may acquire setting information for setting the at least one DOD interval in the SOC usage interval corresponding to the battery, and determine the at least one DOD interval corresponding to the SOC interval based on the setting information. The recoverable capacity obtaining module 52 is for obtaining a recoverable amount of capacity fade of the battery according to the at least one DOD interval, the number of cycles and the cycle temperature. The available capacity correcting module 53 is for determining an actual available capacity of the battery based on the recoverable amount of capacity fade.

Figure 7:
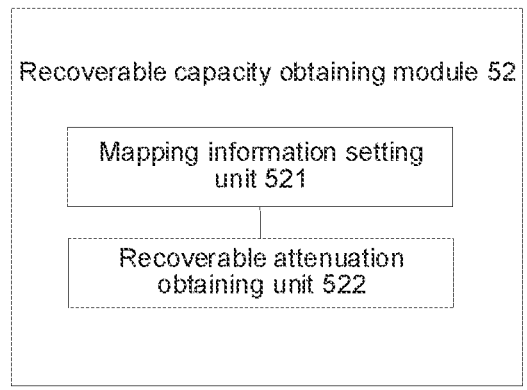
FIG. 7 is a schematic block diagram illustrating a recoverable capacity obtaining module in one embodiment of a device for determining an available capacity of a battery according to the present disclosure.

In one embodiment, as shown in FIG. 7, the recoverable capacity obtaining module 52 comprises: a mapping information setting unit 521 and a recoverable attenuation obtaining unit 522. The mapping information setting unit 521 pre-establishes correspondence information between the recoverable amount of capacity fade and the at least one DOD interval, the number of cycles, and cycle temperature.

The recoverable attenuation obtaining unit 522 obtains a recoverable amount of capacity fade corresponding to the at least one DOD interval, the number of cycles, and the cycle temperature based on the correspondence information.

Figure 6:
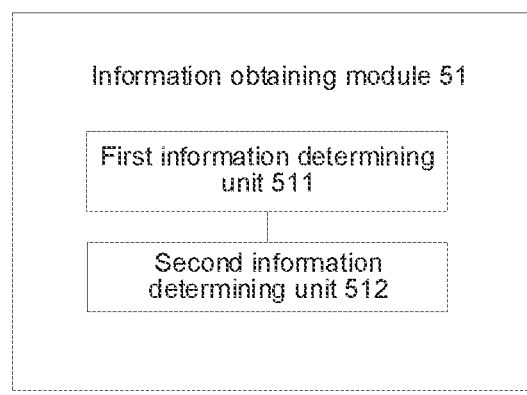
FIG. 6 is a schematic block diagram illustrating an information obtaining module in one embodiment of a device for determining an available capacity of a battery according to the present disclosure.
Figure 8:
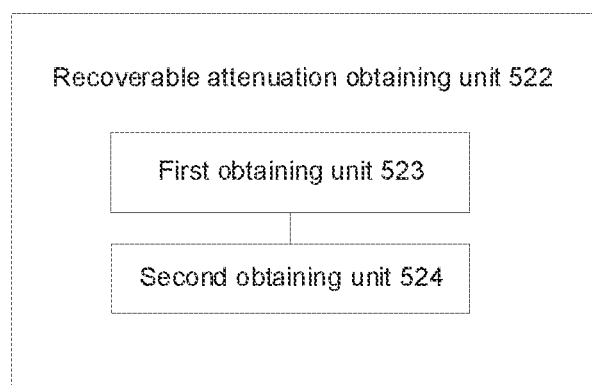
FIG. 8 is a schematic block diagram illustrating a recoverable attenuation obtaining unit in one embodiment of a device for determining an available capacity of a battery according to the present disclosure.

As shown in FIG. 6, the information obtaining module 51 comprises: a first information determining unit 511 and a second information determining unit 512. As shown in FIG. 8, the recoverable attenuation obtaining unit 522 comprises: a first obtaining unit 523 and a second obtaining unit 524.

The first information determination unit 511 determines the SOC interval based on a first SOC of the battery before charging and a second SOC of the battery after charging; obtains at least one DOD interval corresponding to the SOC interval, and obtains the number of cycles and the cycle temperature corresponding to each DOD interval. The first obtaining unit 523 obtains an interval recoverable amount of capacity fade corresponding to each DOD interval based on the correspondence information and according to the at least one DOD interval, the number of cycles and the cycle temperature. The first obtaining unit 523 obtains a first single recoverable amount of capacity fade of the battery in the current operation based on at least one interval recoverable amount of capacity fade, and obtains the recoverable amount of capacity fade of the battery under the current operating condition according to the first single recoverable amount of capacity fade.

The first obtaining unit 523 obtains one or more second single recoverable amount of capacity fade corresponding to one or more previous operations of the battery; and processes the one or more second single recoverable amount of capacity fade and the first single recoverable amount of capacity fade according to a preset first calculation rule, to obtain the recoverable amount of capacity fade of the battery under the current operating condition.

The first obtaining unit 523 obtains a second single recoverable amount of capacity fade corresponding to a last operation of the battery; obtains two weight values corresponding to the second single recoverable amount of capacity fade and the first single recoverable amount of capacity fade, and performs a weighted calculation on the second single recoverable amount of capacity fade and the first single recoverable amount of capacity fade based on the two weight values to obtain the recoverable amount of capacity fade of the battery under the current operating condition.

The second information determining unit 512 obtains a plurality of SOC intervals corresponding to multiple cycles of the battery; obtains a plurality of DOD intervals corresponding to the plurality of SOC intervals. The second information determining unit 512 obtains the number of cycles and the cycle temperature corresponding to each DOD interval. The second obtaining unit 524 obtains a plurality of interval recoverable amounts of capacity fade corresponding to the plurality of DOD intervals based on the correspondence information and according to the DOD intervals, the number of cycles and the cycle temperature. The second obtaining unit 524 obtains the recoverable amount of capacity fade of the battery under the current operating condition according to the plurality of interval recoverable amounts of capacity fade.

The second obtaining unit 524 obtains an interval recoverable amount of capacity fade corresponding to each SOC interval from the plurality of interval recoverable amounts of capacity fade. The second obtaining unit 524 obtains an accumulated recoverable amount of capacity fade corresponding to each SOC interval based on the interval recoverable amount of capacity fade corresponding to each SOC interval; and processes a plurality of accumulated recoverable amounts of capacity fade corresponding to the plurality of SOC intervals according to a preset second calculation rule, to obtain the recoverable amount of capacity fade of the battery under the current operating condition.

The second obtaining unit 524 obtains a plurality of weight values corresponding to the plurality of accumulated recoverable amounts of capacity fade, and performs weighted calculation on the plurality of accumulated recoverable amounts of capacity fade based on the plurality of weight values, to obtain the recoverable amount of capacity fade of the battery under the current operating condition.

The available capacity correcting module 53 obtains a first available capacity of the battery based on battery operation data; calculates the actual available capacity of the battery based on the first available capacity and the recoverable amount of capacity fade, and obtains a state of health of the battery based on the actual available capacity.

If the recoverable amount of capacity fade is greater than or equal to a preset threshold, the recoverable capacity processing module 54 determines that the recoverable amount of capacity fade of the battery needs to be eliminated and an operation is made accordingly. The recoverable capacity processing module 54 determines a number of times of charging and discharging, and performs a full charge and full discharge cycle operation on the battery according to the number of times of charging and discharging, to eliminate the recoverable amount of capacity fade of the battery.

Figure 9:
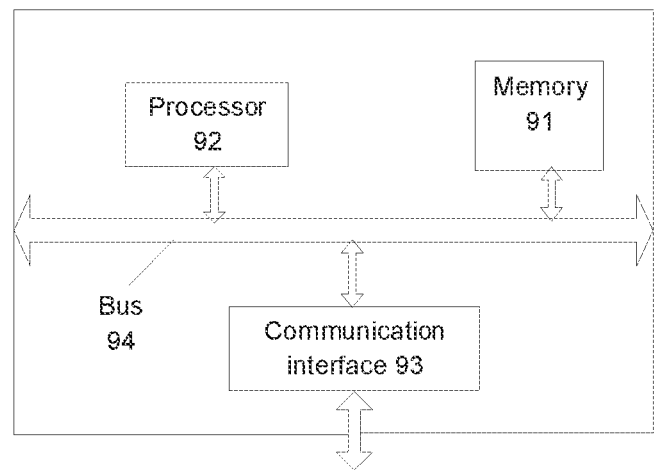
FIG. 9 is a schematic block diagram of another embodiment of a device for determining an available capacity of battery according to the present disclosure.

FIG. 9 is a block diagram of another embodiment of a device for determining an available capacity of a battery according to the present disclosure. As shown in FIG. 9, the device may comprise a memory 91, a processor 92, a communication interface 93, and a bus 94. The memory 91 is for storing instructions and the processor 92 is coupled to the memory 91, and the processor 92 is configured to perform the above-described method for determining an available capacity of a battery based on the instructions stored in the memory 91.

The memory 91 may be a high-speed RAM memory, a non-volatile memory, or the like, and the memory 91 may be also a memory array. The memory 91 may also be divided into blocks and the blocks may be combined into virtual volumes according to certain rules. The processor 92 may be a central processing unit CPU, or an Application Specific Integrated Circuit (ASIC), or one or more Integrated circuits configured to implement the method for determining an available capacity of a battery according to the present disclosure.

In one embodiment, the present disclosure provides a battery management system comprising the device for determining an available capacity of a battery as in any of the above embodiments. The battery management system may be installed in a vehicle or the like, and may manage the battery.

In one embodiment, the present disclosure provides a computer-readable storage medium having stored thereon computer instructions that, when executed by a processor, implement the method for determining an available capacity of a battery as in any one of the above embodiments.

The method and device for determining an available capacity of a battery, the battery management system and the storage medium in the above embodiments obtain the at least one DOD interval corresponding to the SOC interval of the operation of the battery, and the number of cycles and the cycle temperature corresponding to the at least one DOD interval, obtain a recoverable amount of capacity fade of the battery according to the at least one DOD interval, the number of cycles and the cycle temperature, and correct the available capacity of the battery. With respect to the battery with the recoverable amount of attenuation capacity, the recoverable amount of capacity fade of the battery is obtained, the available capacity is estimated based on the recoverable amount of capacity fade, which improves the accuracy of estimating the actual available capacity and the SOH, can improve reliability of the battery, and can prolong the service life of the battery and the use experience of the user.

The method and system of the present disclosure may be implemented in a number of ways. For example, the method and system of the present disclosure may be implemented by software, hardware, firmware, or any combination of software, hardware, and firmware. The above-described order of the steps for the method is for illustration only, and the steps of the method of the present disclosure are not limited to the order specifically described above unless specifically stated otherwise. Further, in some embodiments, the present disclosure may also be embodied as programs recorded in a recording medium, the programs including machine-readable instructions for implementing the method according to the present disclosure. Thus, the present disclosure also covers a recording medium storing a program for executing the method according to the present disclosure.

The description of the present disclosure has been presented for purposes of illustration and description, and is not intended to be exhaustive or limited to the disclosure in the form disclosed. Many modifications and variations will be apparent to those of ordinary skill in the art. The embodiments were chosen and described in order to best explain the principles of the disclosure and the practical application thereof, and to enable those of ordinary skill in the art to understand the present disclosure and thus design various embodiments with various modifications as are suited to particular uses.

What is claimed is:

1. A method for determining an available capacity of a battery, executed by a processor located in a device for determining the available capacity of a battery, comprising:
   collecting a first State of Charge (SOC) of the battery before the battery is charged and a second SOC of the battery after the battery is charged;
   determining a State of Charge (SOC) interval of the battery based on the first SOC of the battery before the battery is charged and the second SOC of the battery after the battery is charged;
   determining at least one Depth of Discharge (DOD) interval set in the SOC interval based on setting information, wherein the DOD interval is an SOC operation interval set in an SOC usage interval which is 0 to 100%;
   determining a number of cycles and a cycle temperature of the battery in the at least one DOD interval, wherein the number of cycles is a number of cycle operations of the battery in one DOD interval, and wherein the cycle temperature is a battery temperature at which the battery operates in one DOD interval;
   determining an interval recoverable amount of capacity fade of the battery based on correspondence information between an interval recoverable amount of capacity fade, and the at least one DOD interval, the number of cycles and the cycle temperature in the at least one DOD interval, wherein the correspondence information is calibrated by performing an operating condition cycle test to test the recoverable amount of capacity fade corresponding to different DOD intervals, different numbers of cycles and different cycle temperatures, and wherein the correspondence information comprises a functional relation, a table, or a model;

determining a first single recoverable amount of capacity fade of the battery in a current operation by adding a plurality of interval recoverable amounts of capacity fade;

determining a second single recoverable amount of capacity fade of the battery in the last operation;

determining the recoverable amount of capacity fade of the battery under the current operating condition by performing a weighted calculation on the second single recoverable amount of capacity fade and the first single recoverable amount of capacity fade; and correcting an actual available capacity of the battery based on the recoverable amount of capacity fade of the battery.

2. The method according to claim 1, wherein the recoverable amount of capacity fade of the battery under the current operating condition is $Dnew=\alpha1 D1+\alpha2 D2$, where D1 is the second single recoverable amount of capacity fade, D2 is the first single recoverable amount of capacity fade, $\alpha1$ and $\alpha2$ are weight values, and a numerical range of $\alpha1$ and $\alpha2$ is $[-1, 1]$.

3. The method according to claim 1, wherein correcting an actual available capacity of the battery based on the recoverable amount of capacity fade comprises:

calculating a first available capacity of the battery by linear interpolation of an accumulated ampere-hour value based on battery operation data;

calculating the actual available capacity of the battery by adding the first available capacity to the recoverable amount of capacity fade; and obtaining a state of health of the battery based on the actual available capacity.

4. The method according to claim 1, further comprising:
under the condition that the recoverable amount of capacity fade is greater than or equal to a preset threshold, determining that the recoverable amount of capacity fade of the battery needs to be eliminated.

5. The method according to claim 4, further comprising:
under the condition that the recoverable amount of capacity fade is greater than or equal to a preset threshold, performing N full charge and full discharge cycle operations on the battery according to the number of times of charging and discharging, to eliminate the recoverable amount of capacity attenuation of the battery, wherein N is the number of charge and discharge cycles required to eliminate the capacity fade under the current recoverable amount of capacity fade measured by the experiments.

* * * * *